United States Patent
Ezaki et al.

(10) Patent No.: US 7,459,735 B2
(45) Date of Patent: Dec. 2, 2008

(54) SOLID-STATE IMAGE DEVICE

(75) Inventors: Takayuki Ezaki, Saitama (JP); Teruo Hirayama, Kanagawa (JP); Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 329 days.

(21) Appl. No.: 11/094,072

(22) Filed: Mar. 30, 2005

(65) Prior Publication Data

US 2005/0179053 A1    Aug. 18, 2005

(30) Foreign Application Priority Data

Apr. 2, 2004    (JP) .......................... P2004-110305

(51) Int. Cl.
*H01L 31/112*    (2006.01)

(52) U.S. Cl. .................. 257/292; 257/913; 257/446; 257/E27.139; 438/58

(58) Field of Classification Search .................. 257/446, 257/72, 292, 913; 438/58
See application file for complete search history.

(56) References Cited

U.S. PATENT DOCUMENTS

| 5,670,817 | A | * | 9/1997 | Robinson ..................... 257/443 |
| 7,132,702 | B2 | * | 11/2006 | Narui et al. .................. 257/228 |
| 2005/0104100 | A1 | * | 5/2005 | Ishida et al. ................. 257/292 |
| 2008/0083940 | A1 | * | 4/2008 | Ezaki et al. .................. 257/292 |

\* cited by examiner

*Primary Examiner*—Jerome Jackson, Jr.
*Assistant Examiner*—Paul A Budd
(74) *Attorney, Agent, or Firm*—Sonnenschein Nath & Rosenthal LLP

(57) ABSTRACT

A solid-state imaging device capable of reducing the occurrence of a dark current and a pixel defect is provided.

A solid-state imaging device 10 is formed in which a plurality of photoelectric conversion elements 4 are formed in a semiconductor substrate 1; circuits 5 which read out signal charge from each of the plurality of photoelectric conversion elements 4 are respectively formed on the semiconductor substrate 1; light is applied from the opposite side to the circuits 5 which read out signal charge from each of the plurality of photoelectric conversion elements; and a gettering region is provided in an element-isolation area 2 which separate the photoelectric conversion elements 4 adjacent to each other.

2 Claims, 10 Drawing Sheets

US 7,459,735 B2

SOLID-STATE IMAGE DEVICE

BACKGROUND OF THE INVENTION

1. Field of the Invention

The present invention relates to a solid-state imaging device and a production method thereof.

2. Description of the Related Art

As a solid-state imaging device, a structure in which each element, each film, and so on are formed on the front surface side of a semiconductor substrate and an image is picked up by making light enter from the front surface side has conventionally been employed.

However, in the case of such structure, incident light is absorbed or reflected by each element, each film, and so on formed on the front surface side, so that photoelectric conversion efficiency of incident light is low, hence the structure has low sensitivity.

Therefore, as a structure which solves this kind of problem, what is called a back-illuminated type solid-state imaging device has recently been used, in which each element, each film, and so on are formed on the front surface side of a semiconductor substrate, whereas light is made enter from the back surface side of the semiconductor substrate to pick up an image, so that the aperture ratio to receive light increases and the absorption or reflection of incident light is reduced (refer to Patent Literature 1, for example).

A solid-state imaging device having the above-described structure, for example, having the structure of a CMOS-type solid-state imaging device is explained referring to FIGS. 1A and 1B.

FIG. 1A shows a schematic plan view of an imaging area seen from the back surface side, and FIG. 1B shows a schematic sectional view of an A-A line in FIG. 1A.

A CMOS-type solid-state imaging device 50 includes photoelectric conversion elements (what is called photodiode (PD) portions) 54 each made of a concentrated N-type semiconductor area are formed in unit pixel areas 53 which are separated by an element-isolation area 52 formed in a semiconductor substrate 51 (single-crystal silicon layer, for example).

Further, circuits (readout circuits) 55 which read out signal charge stored in each of the photoelectric conversion elements 54 are respectively formed on one surface of the single-crystal silicon layer 51, namely on the front surface side (upper side in the figure) of the single-crystal silicon layer 51, and a wiring layer 56 is formed above those readout circuits 55.

Further, on-chip lenses 57 are formed on the other surface of the single-crystal silicon layer 51, that is, on the back surface side (lower side in the figure) of the single-crystal silicon layer 51 at positions corresponding to the photoelectric conversion elements 54 with a planarizing film (passivation film) 59 in between.

Each readout circuit 55 specifically includes: a readout gate portion 63 made of a P-type semiconductor area; a floating diffusion portion (FD portion) 64 adjacent to the readout gate portion 63, which is made of a concentrated N-type semiconductor area and converts a signal charge stored in a photoelectric conversion element 54 into a voltage; and a readout electrode 66 formed on the readout gate portion 63.

In addition, a reference numeral 67 denotes a second element-isolation area made of a P-type semiconductor area. Further, a reference numeral 68 denotes an electric charge storage area made of a concentrated P-type semiconductor area, which is formed on the front surface side of the photoelectric conversion element 54.

Furthermore, although not shown in the figures, each of those unit pixel areas 53 includes a reset gate portion which sweeps out a signal charge stored in the floating diffusion portion 64, an output portion (output amplifier) which outputs a voltage converted at the floating diffusion portion 64 and the like.

The wiring layer 56 has wiring of two layers, for example.

Specifically, in an insulating layer 74 formed on the single-crystal silicon layer 51, the wiring layer 56 includes first-layer wiring 561 and second-layer wiring 562 which is formed on the first-layer wiring 561 with the insulating layer 74 in between.

In addition, on the insulating layer 74 is formed a planarizing film made of a passivation film, and on the planarizing film is stuck a supporting substrate 58 through an adhesive layer (not shown in the figure).

Then, in the CMOS-type solid-state imaging device 50 thus constructed, image light (arrow marks X in the figure) is made to enter from the back surface side of the single-crystal silicon layer 51.

[Patent Literature 1] Published Japanese Patent Application No. 2003-31785 (refer to paragraph nos. [0027] to [0029] and FIG. 3)

SUMMARY OF THE INVENTION

Hereupon, regarding the above-described CMOS-type solid-state imaging device 50, there may occur such a problem that a crystalline defect occurs in the middle of the production process in the single-crystal silicon layer 51 (in the vicinity of the back surface side, for example) due to, for example, the stress generated in the single-crystal silicon constituting the semiconductor substrate 51.

Further, due to the fact that there exist, for example, unnecessary metal impurities in the single-crystal silicon layer 51, such a problem as metal pollution occurs.

If a crystalline defect occurs as described above, a dark current is generated in the solid-state imaging device 50 after produced, for example; and if metal pollution occurs, an image defect (white spot) is generated, for example.

The occurrence of such dark current and image defect may be a cause to deteriorate the performance of the solid-state imaging device 50.

In light of the above-described problems, according to the present invention a solid-state imaging device having a structure capable of reducing the occurrence of a dark current and a pixel defect is provided.

Further, according to the present invention a production method of a solid-state imaging device having a structure capable of repairing a crystalline defect and absorbing unnecessary impurities is provided.

A solid-state imaging device according to the present invention includes a plurality of photoelectric conversion elements formed in a semiconductor substrate, circuits formed on the semiconductor substrate which read out signal charge from each of the plurality of photoelectric conversion elements, and a gettering region formed in an element-isolation area which separates the photoelectric conversion elements adjacent to each other, wherein the circuits are placed on a first surface side of the semiconductor substrate and light is applied from a second surface side of the semiconductor substrate which is opposite to the first surface side.

According to the solid-state imaging device of the present invention, since the gettering region is formed in the element-isolation area which separates photoelectric conversion elements adjacent to each other, a crystalline defect can be repaired and impurities can be absorbed by the gettering region. Hence, the occurrence of a dark current caused by, for example, a crystalline defect is suppressed and the progress of pollution caused by unnecessary impurities is restrained to reduce the occurrence of an image defect (white spot).

A method of producing a solid-state imaging device according to the present invention includes the processes of forming a plurality of photoelectric conversion elements in a semiconductor substrate, forming circuits on a first surface side of the semiconductor substrate which read out signal charge from each of the plurality of photoelectric conversion elements, the first surface side being opposite to a second surface side of the semiconductor substrate from which light is received, and forming a gettering region in an element-isolation area which separates the photoelectric conversion elements adjacent to each other by injecting impurities from the second surface side of the semiconductor substrate.

According to the production method of a solid-state imaging device according to the present invention, since the process of forming a gettering region in an element-isolation area which separates photoelectric conversion elements adjacent to each other by injecting impurities from the second surface side of the semiconductor substrate is included, a crystalline defect which occurs, for example, in the middle of the production process on the back surface side of a semiconductor substrate can be repaired and unnecessary impurities are absorbed to restrain the progress of pollution caused by the impurities. Accordingly, a solid-state imaging device can be manufactured in which the occurrence of a dark current caused by a crystalline defect and the occurrence of a pixel defect (white spot) resulted from pollution caused by impurities are reduced.

DESCRIPTION OF THE PREFERRED EMBODIMENTS

Hereinafter, embodiments of the present invention will be described referring to drawings.

Figure 1A:
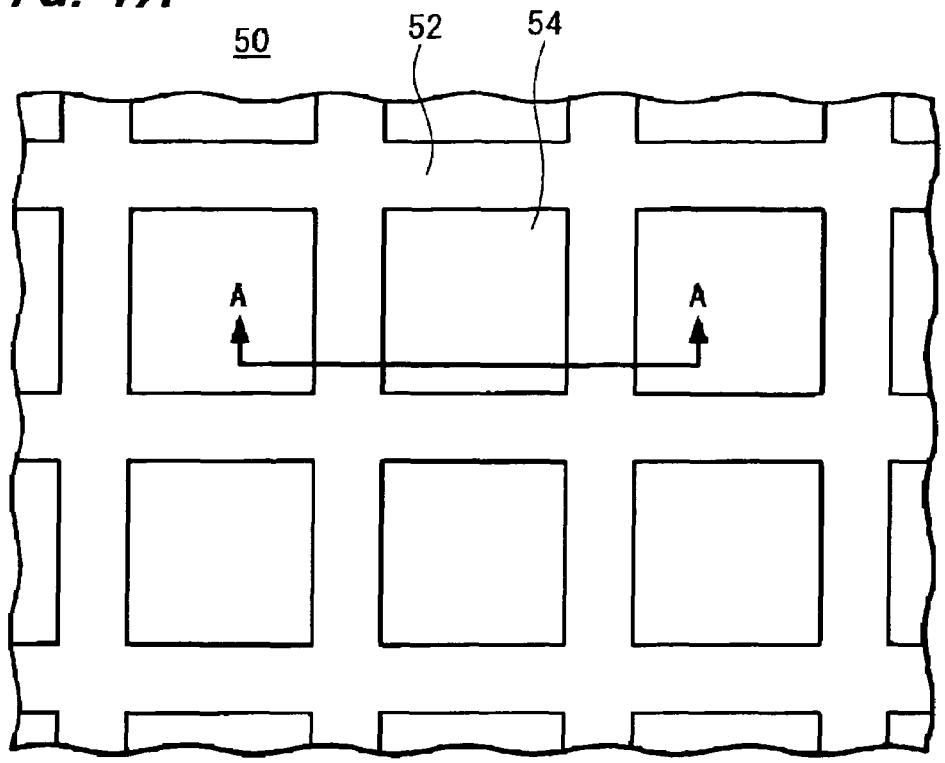
FIGS. 1A and 1B are schematic constitutional views showing a conventional solid-state imaging device.
Figure 1B:
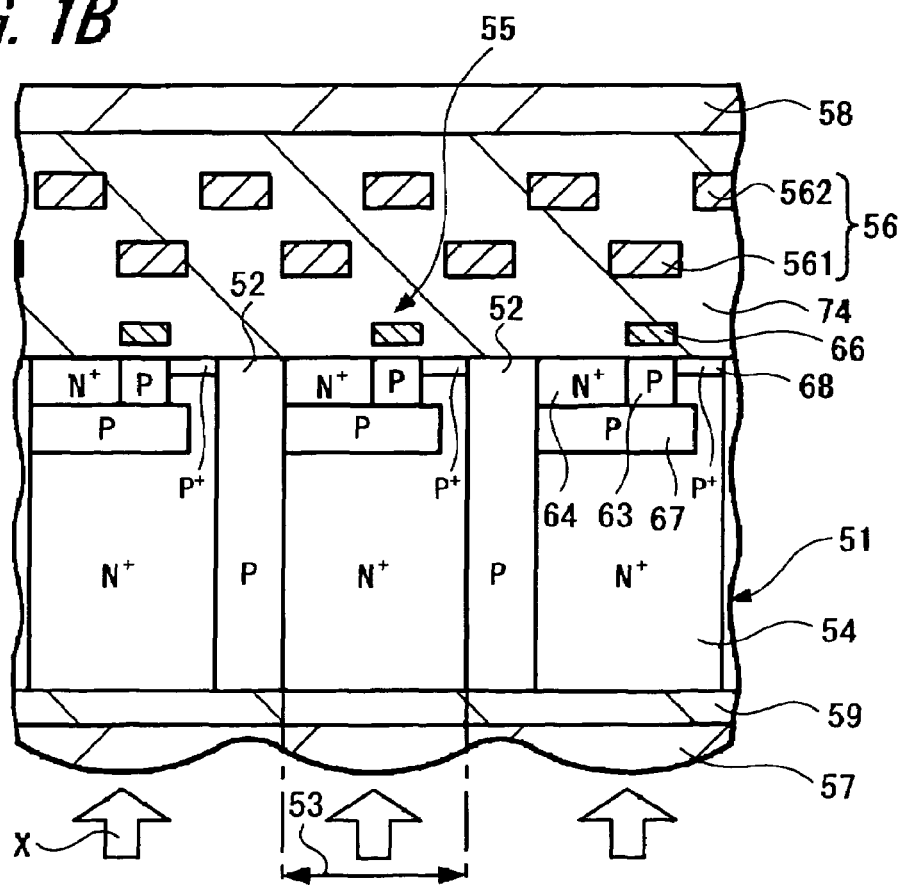
Figure 2A:
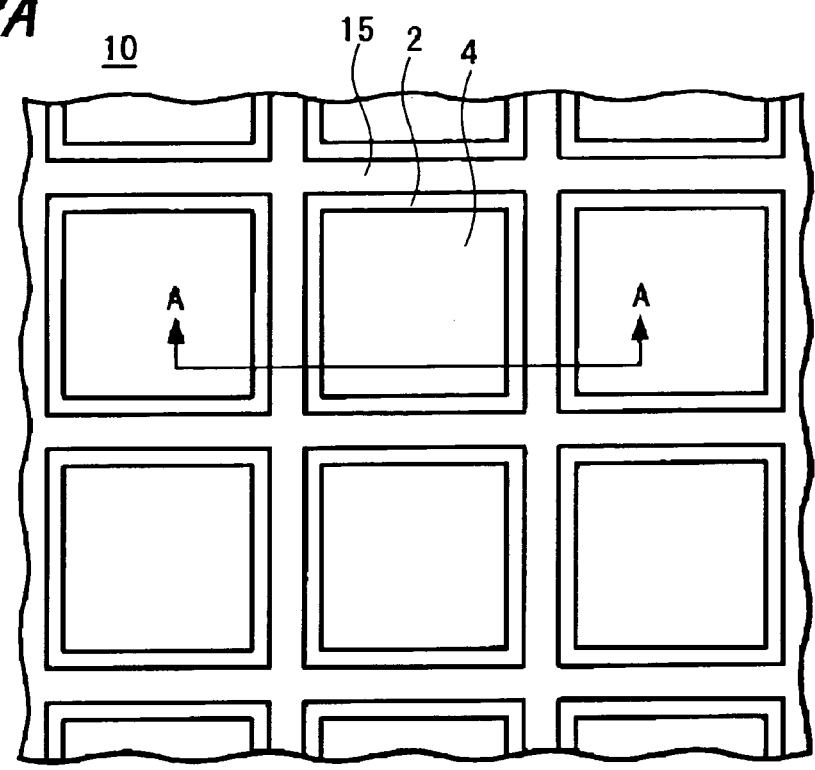
FIGS. 2A and 2B are schematic constitutional views showing an embodiment of a solid-state imaging device of the present invention.
Figure 2B:
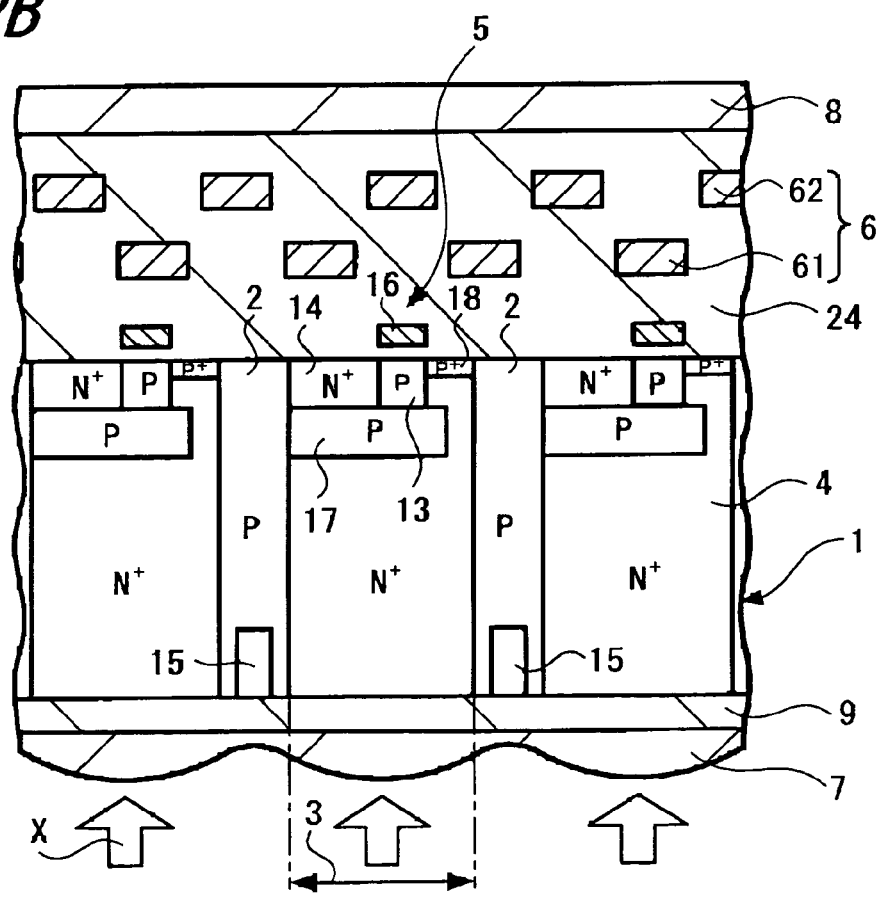

First, a schematic constitutional view of an embodiment of a solid-state imaging device, for example, a CMOS-type solid-state imaging device to which a production method of a solid-state imaging device according to the present invention is applied is explained referring to FIGS. 2A and 2B.

FIG. 2A shows a schematic plan view of an imaging area seen from the back surface side; and FIG. 2B shows a schematic sectional view of an A-A line in FIG. 2A.

In a CMOS-type solid-state imaging device 10, photoelectric conversion elements (what is called photodiode (PD) portions) 4 each made from a concentrated N-type semiconductor area are formed in unit pixel areas 3 which are separated from each other by an element-isolation area 2 formed in a semiconductor substrate 1 (single-crystal silicon layer, for example). Specifically, the photoelectric conversion elements are made in the shape of a matrix. Circuits (readout circuits) 5 which read out signal charge stored in each of the photoelectric conversion elements 4 are respectively formed on one surface of the single-crystal silicon layer 1, namely on the front surface side (upper side in the figure) of the single-crystal silicon layer 1, and a wiring layer 6 is formed above those readout circuits 5. Also, on-chip lenses 7 corresponding to the photoelectric conversion elements 4 are formed on the other surface of the single-crystal silicon layer 1, namely on the back surface side (lower side in the figure) of the single-crystal silicon layer 1.

Each readout circuit 5 specifically includes a readout gate portion 13 made of a P-type semiconductor area, a floating diffusion portion (FD portion) 14 adjacent to the readout gate portion 13, which is made from a concentrated N-type semiconductor area and converts a signal charge stored in a photoelectric conversion element 4 into a voltage, and a readout electrode 16 formed above the readout gate portion 13.

In addition, a reference numeral 17 denotes a second element-isolation area made of a P-type semiconductor area. Further, a reference numeral 18 denotes an electric charge storage area made of a concentrated P-type semiconductor area, which is formed on the front surface side of the photoelectric conversion element 4.

Further, although not shown in the figures, in each of those unit pixel areas 3, a reset gate portion which sweeps out a signal charge stored in the floating diffusion portion 14, an output portion (output amplifier) which outputs a voltage obtained through conversion at the floating diffusion portion 14, and the like are provided.

The wiring layer 6 has two-layer wiring, for example.

Specifically, in an insulating layer 24 formed on the single-crystal silicon layer 1, the wiring layer 6 includes first-layer wiring 61 and second-layer wiring 62 which is formed above the first-layer wiring 61 with the insulating layer 24 in between.

In addition, on the insulating layer 24 is formed a planarizing film made of a passivation film, and on the planarizing film is formed a supporting substrate 8 through an adhesive layer (not shown in the figure).

In the CMOS-type solid-state imaging device 10 thus constructed, image light (arrow marks X in the figure) is made to enter from the back surface side of the single-crystal silicon layer 1.

Furthermore, particularly in the CMOS-type solid-state imaging device 10 of this embodiment, a gettering region 15 is formed in an element-isolation area 2 which separates unit pixel areas 3 from each other in both column and row directions.

The gettering region 15 has such characteristics as repairing a crystalline defect generated in the single-crystal silicon layer 1 and absorbing impurities existing in the single-crystal silicon layer 1.

Materials constituting the gettering region 15 can specifically be formed of impurity element, for example, carbon having the above-described characteristics and which is different from the impurity element forming semiconductor areas in the single-crystal silicon layer 1. Further, other than the above, phosphorus (P), arsenic (As) and the like can also be used.

Further, the gettering region 15 is specifically formed in the element-isolation area 2 in the vicinity of the back surface side where image light (refer to the arrow marks X in the figure) enters.

Since the gettering region 15 is formed on the back surface side where image light enters, a crystalline defect which occurs on the back surface side of the single-crystal silicon layer 1 can be repaired more efficiently. Also, impurities existing on the back surface side of the single-crystal silicon layer 1 can be absorbed more efficiently.

It should be noted that if the gettering region 15 is formed directly in contact with photoelectric conversion elements 4, defects may occur around the gettering region 15 depending on the material forming the gettering region 15, which may be a cause of leakage current. Therefore, it is desirable that the gettering region 15 be formed apart from the sidewalls of the photoelectric conversion elements 4.

Further, the shape of the gettering region 15 can be selected arbitrarily.

In FIGS. 2A and 2B, the gettering region 15 is formed to surround the unit pixel areas 3 disposed in the shape of a matrix, that is, the gettering region 15 is formed in the shape of a lattice.

According to the CMOS-type solid-state imaging device 10 of this embodiment thus constructed, in the single-crystal silicon layer 1 the gettering region 15 is formed in the element-isolation area 2 separating the unit pixel areas 3 from each other on the back surface side where image light enters, so that a crystalline defect which occurs particularly on the back surface side in the single-crystal silicon layer 1 can be repaired, and the occurrence of a dark current resulted from such a crystalline defect can be reduced.

Further, since impurities existing particularly on the back surface side in the single-crystal silicon layer 1 can be absorbed, it is possible to restrain the progress of metal pollution or the like caused by unnecessary metal impurities. Accordingly, the occurrence of a pixel defect (white spot) which caused by such metal pollution or the like can be reduced.

Further, since the gettering region 15 is formed in the element-isolation area 2, the occurrence of a dark current and a pixel defect (white spot) can be reduced without increasing the area of the unit pixel area 3.

Furthermore, since the gettering region 15 is formed to surround the photoelectric conversion elements 4, it is possible to repair a crystalline defect which occurs in a large area on the back surface side in the single-crystal silicon layer 1.

Also, it is possible to absorb impurities existing in a large area in the single-crystal silicon layer 1. In other words, greater gettering effectiveness can be obtained.

Figure 3A:
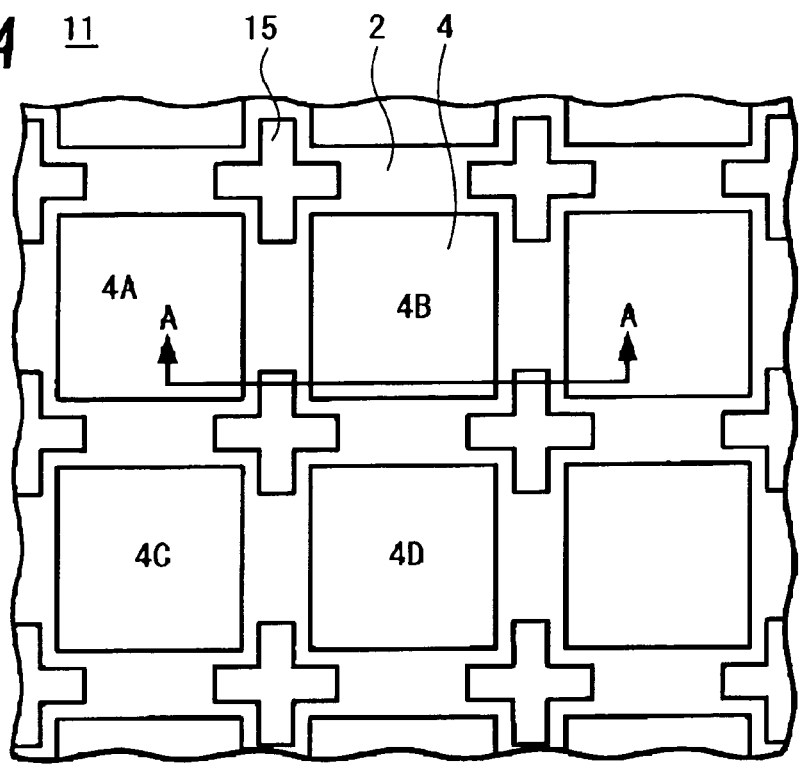
FIGS. 3A and 3B are schematic constitutional views showing another embodiment of a solid-state imaging device of the present invention.
Figure 3B:
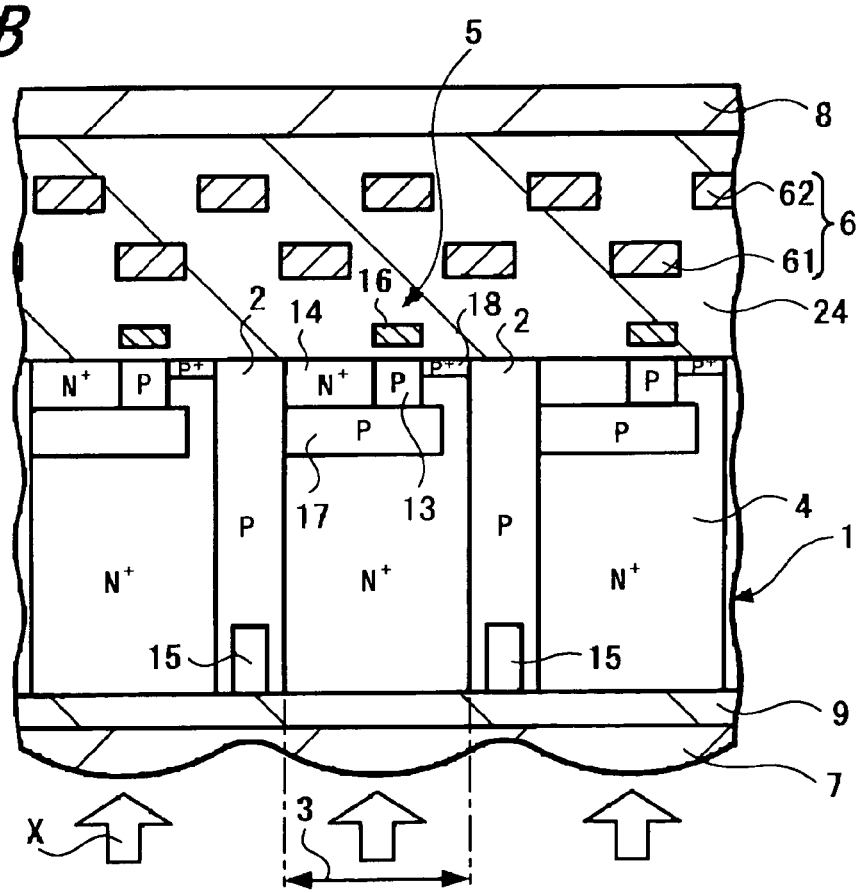

Next, another embodiment of a solid-state imaging device according to the present invention is explained referring to FIGS. 3A and 3B.

Note that also in FIGS. 3A and 3B, FIG. 3A shows a plan view seen from the back surface side, and FIG. 3B shows a sectional view of an A-A line in FIG. 3A.

In the CMOS-type solid-state imaging device 10 of the above-described embodiment, the gettering region 15 is formed in the shape of a lattice surrounding the unit pixel areas 3 disposed in the shape of a matrix, as shown in FIGS. 2A and 2B; whereas in a CMOS-type solid-state imaging device 11 of this embodiment, gettering regions 15 are made in the form of dots.

Specifically, as shown in FIG. 3A, in the solid-state imaging device 11 of this embodiment, a cross-shaped gettering region 15 is formed at each position that is the center of four photoelectric conversion portions 4 (4A, 4B, 4C, 4D, for example).

Note that the specific material and positions (depth) of the gettering regions 15 to be formed can be made similarly to those of the CMOS-type solid-state imaging device 10 of the above-described embodiment.

Also, with respect to the structure other than the above, portions corresponding to those in FIGS. 2A and 2B are given the same numerals as those in the case of the CMOS-type solid-state imaging device 10 of the above-described embodiment and redundant explanation will be omitted.

According to the CMOS-type solid-state imaging device 11 of this embodiment thus constructed, similarly to the case of the solid-state imaging device 10 of the above-described embodiment, a crystalline defect occurred particularly on the back surface side of the single-crystal silicon layer 1 can be repaired, and the occurrence of a dark current can be restrained. Further, since unnecessary impurities existing particularly on the back surface side of the single-crystal silicon layer 1 can be absorbed, it is possible to reduce the occurrence of a pixel defect (white spot). Also, the occurrence of a dark current and a pixel defect can be reduced without increasing the area of the unit pixel area 3.

Further, since the gettering regions 15 are made in the form of dots, such structure can be obtained in which a resist mask is easily formed in, for example, a production process.

Figure 4A:
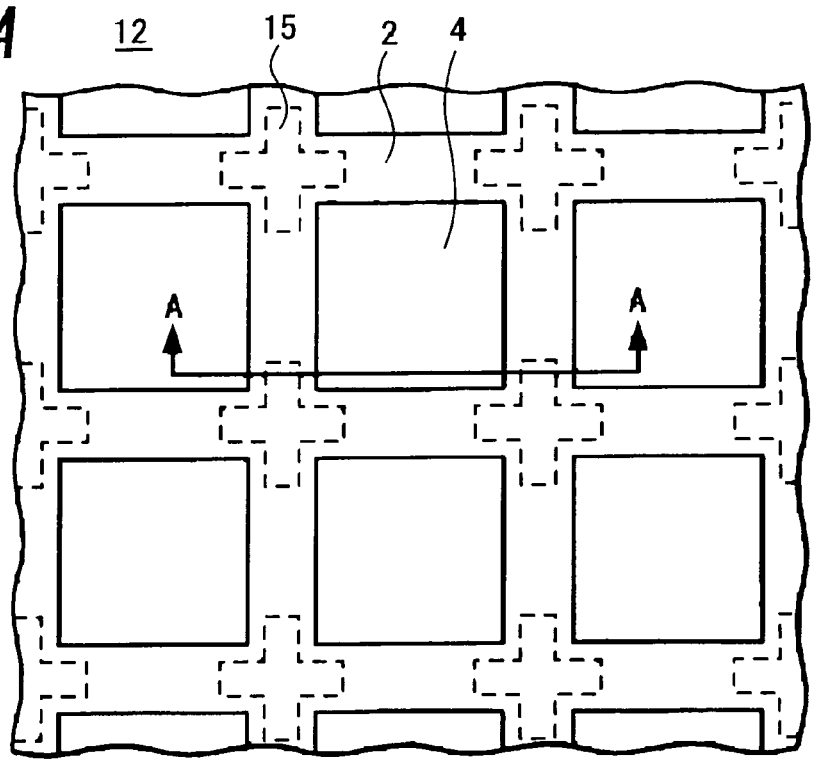
FIGS. 4A and 4B are schematic constitutional views showing another example of positions where gettering regions are formed.
Figure 4B:
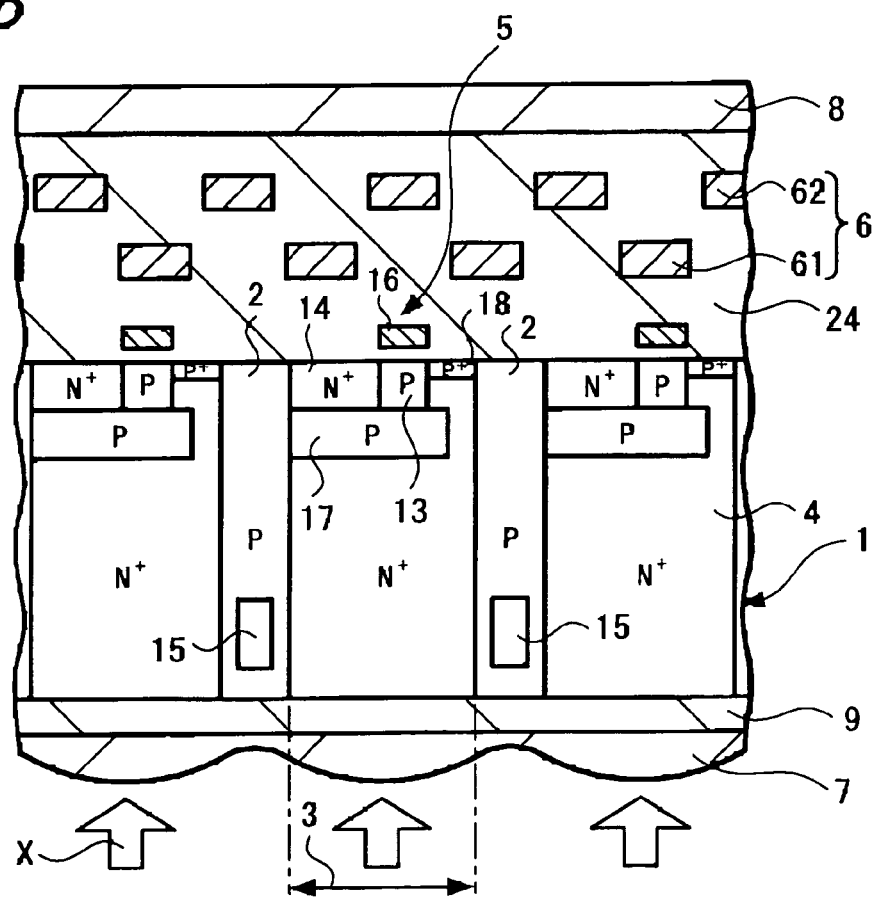

As shown in FIGS. 2A and 2B and FIGS. 3A and 3B, in the above-described embodiments, the gettering region 15 is formed in the element-isolation area 2 on the back surface side where image light enters in a single-crystal silicon layer 1, however, the position (depth) where the gettering region 15 is formed is not necessarily limited to the back surface side but the gettering region 15 can be formed inside the element-isolation area 2 as shown, for example, in FIGS. 4A and 4B.

Note that in FIGS. 4A and 4B, portions corresponding to those in FIGS. 2A and 2B and FIGS. 3A and 3B3 are given the same numerals and redundant explanations will be omitted.

With the gettering region 15 thus constructed, a crystalline defect occurred particularly inside the single-crystal silicon layer 1 can be repaired more efficiently and unnecessary impurities existing particularly inside the single-crystal silicon layer 1 can be absorbed more efficiently.

In the above-described embodiments, the gettering region 15 is formed in the shape of a lattice (refer to FIGS. 2A and 2B) and in the shape of dots (refer to FIGS. 3A and 3B and FIGS. 4A and 4B); however, the shape of the gettering region 15 is not limited to those shapes but can be selected from various other shapes.

Figure 5:
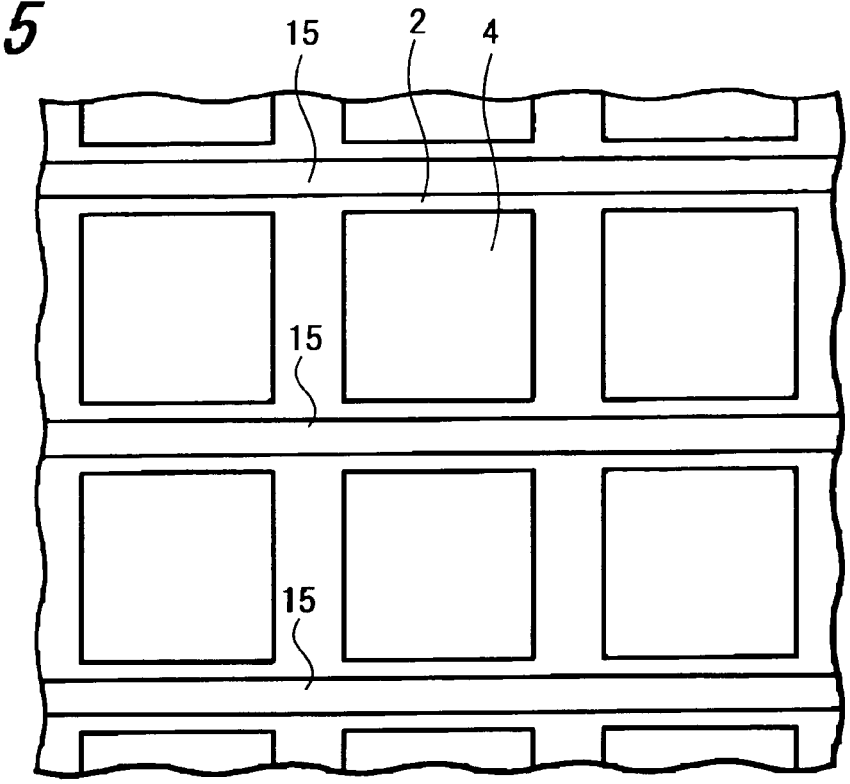
FIG. 5 is a schematic plan view showing another example of the shape of gettering regions.
Figure 6:
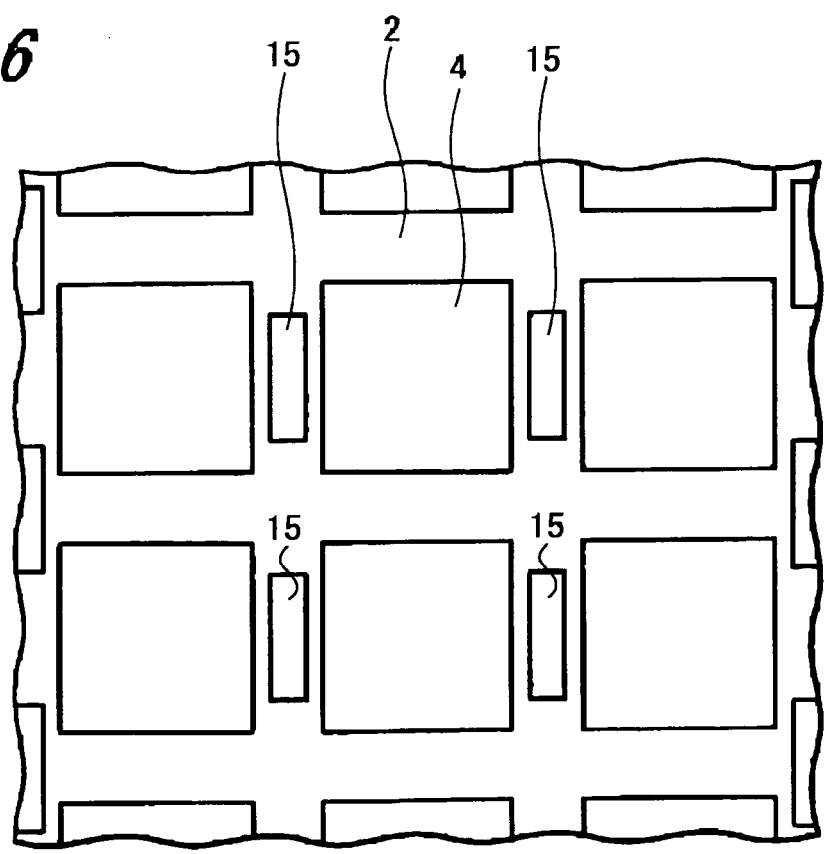
FIG. 6 is a schematic plan view showing yet another example of the shape of gettering regions.

For example, as shown in FIG. 5, it is also possible to form gettering regions 15 extending only in the row direction in the element-isolation area 2. Further, as shown in FIG. 6, it is also possible to make gettering regions 15 not extend in the column direction, namely, to make island-shaped gettering regions 15 in the form of dots at positions between the columns of the photoelectric conversion elements 4 in the element-isolation area 2.

In the cases where gettering regions 15 are thus formed, the same effectiveness as in the cases of the CMOS-type solid-state imaging devices 10 and 11 of the above-described embodiments can also be obtained.

Further, although not shown in the figures, it is also possible to form gettering regions 15 between rows and columns at specific intervals. That is, gettering regions 15 are formed in the element-isolation area 2 only at specific intervals between the rows or columns of photoelectric conversion elements 4 disposed in a matrix shape.

In the case where gettering regions 15 are thus formed, the same effectiveness as those of the CMOS-type solid-state imaging devices 10 and 11 of the above-described embodiments can be obtained, in which a resist mask can be obtained further easily because the gettering regions 15 are provided at intervals between specific rows and columns.

Needless to say, other shapes and positions (depth) of the gettering region 15 to be formed can also be conceivable.

As described above, the shape and position (depth) of the gettering region 15 can be selected, considering a position where a crystalline defect tends to occur, a position where impurities exist in large amounts and the like on the back surface side of the single-crystal silicon layer 1 and inside thereof. Further, the shape may be selected considering, for example, the easiness when a mask used for forming the gettering region 15 is produced in a production process.

Next, as an embodiment of a production method of the present invention, a method for producing the solid-state imaging device 10 shown in FIGS. 2A and 2B is explained referring to FIGS. 7 to 14. Note that portions corresponding to those in FIG. 2 are given the same numerals.

Figure 7:
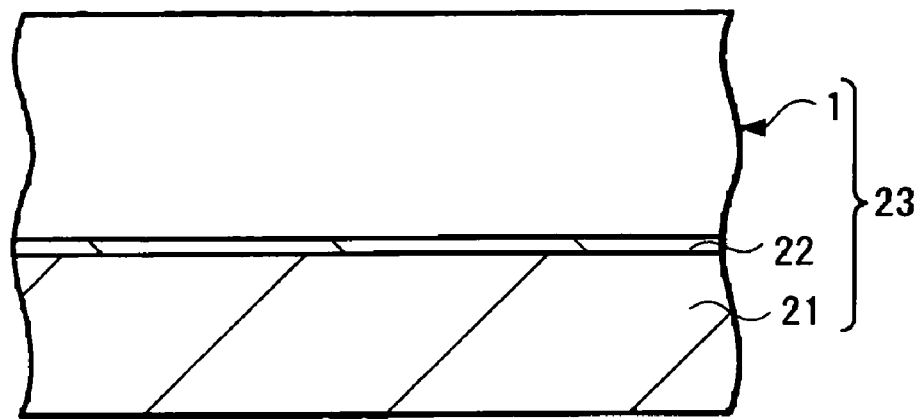
FIG. 7 is a (first) production process diagram showing an embodiment of a production method of a solid-state imaging device of the present invention.

First, as shown in FIG. 7, an SOI substrate 23 is prepared in which a single-crystal silicon layer 1 is formed on a supporting substrate (silicon substrate) 21 made of, for example, silicon with a buried oxide film (what is called a BOX layer) 22 positioned in between. The SOI substrate 23 can be formed by, for example, a bonding method, hydrogen-ion implantation method and the like.

Figure 8:
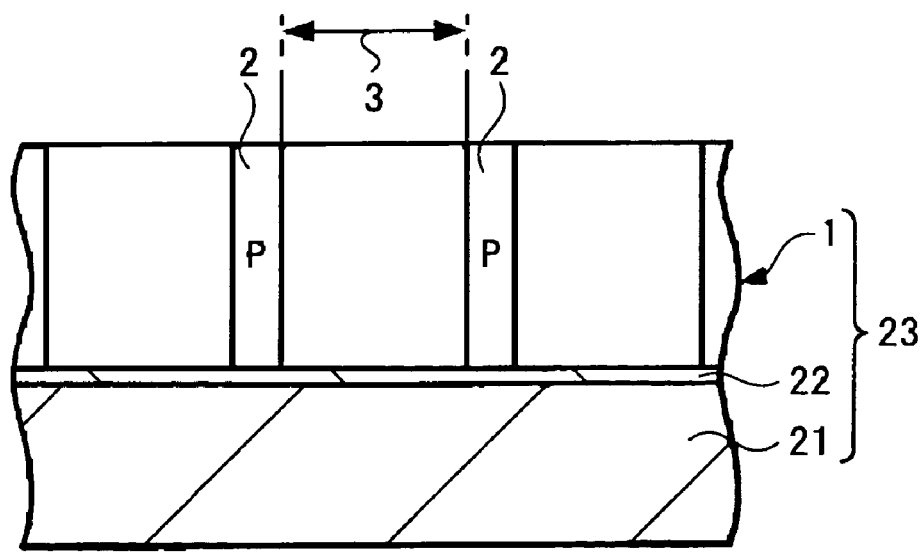
FIG. 8 is a (second) production process diagram showing an embodiment of a production method of a solid-state imaging device of the present invention.

Next, an element-isolation area 2 is formed in predetermined positions in the single-crystal silicon layer 1 of the SOI substrate 23, respectively and as shown in FIG. 8, unit pixel areas 3 separated from each other by the element-isolation area 2 are formed in the single-crystal silicon layer 1.

Figure 9:
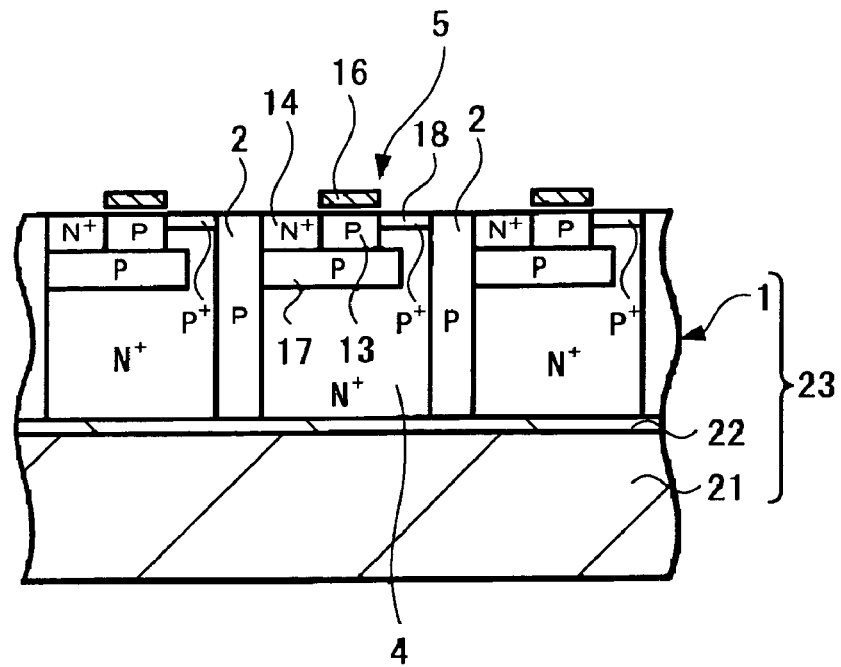
FIG. 9 is a (third) production process diagram showing an embodiment of a production method of a solid-state imaging device of the present invention.

Then, as shown in FIG. 9, in accordance with a conventionally known method, a photoelectric conversion element 4 is formed in a predetermined position in each of the unit pixel areas 3. Further, a readout circuit 5 which reads out signal charge stored in the photoelectric conversion element 4 is formed on the front surface side of each of the photoelectric conversion elements 4.

Hereupon, each readout circuit 5 is constructed by forming a floating diffusion portion 14, a readout gate portion 13, a second element-isolation area 17 and a surface electric charge storage area 18 in predetermined positions in the single-crystal silicon layer 1, and by forming a readout electrode 16 on a predetermined position above the single-crystal silicon layer 1.

Figure 10:
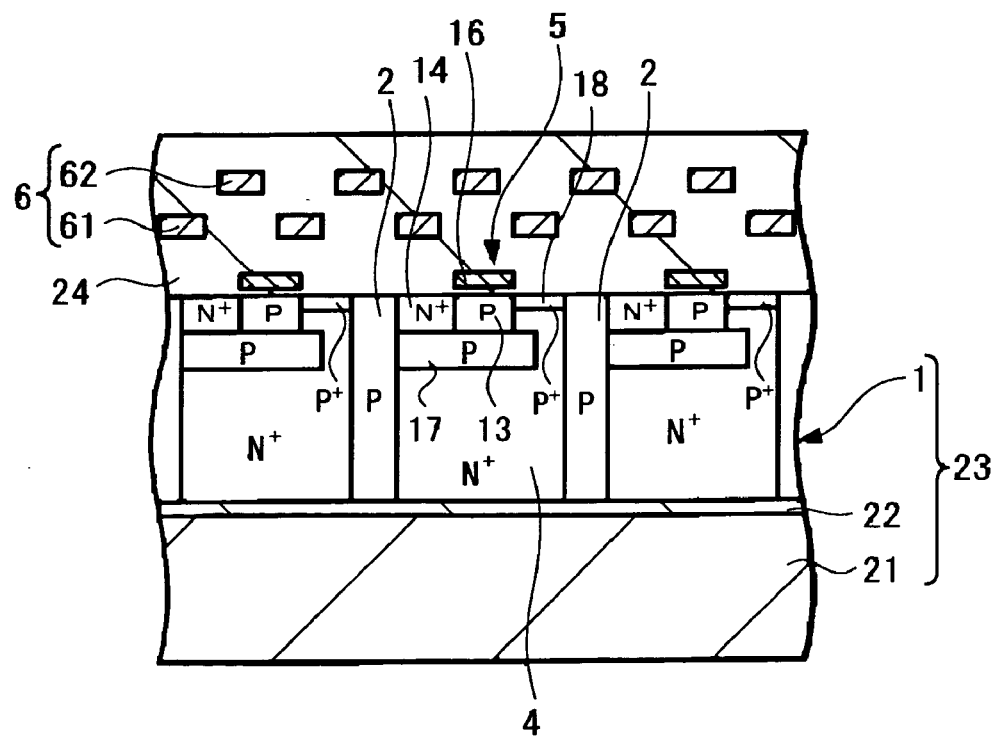
FIG. 10 is a (fourth) production process diagram showing an embodiment of a production method of a solid-state imaging device of the present invention.

Next, as shown in FIG. 10, a wiring layer 6 is formed on the front surface side of the single-crystal silicon layer 1.

Specifically, after an insulating layer 24 is first formed on the whole surface of the SOI substrate 23 and planarizing processing is executed, wiring 61 to be a first layer is formed in a predetermined pattern.

Next, after an insulating layer 24 is again formed on the whole surface including the surface of the first-layer wiring 61, and planarizing processing is executed, wiring 62 to be a second layer is formed in a predetermined pattern.

After that, on the insulating layer 24 is formed a planarizing film made of, for example, an SiN film, SiON film, or the like.

Note that, FIG. 10 shows a case in which a wiring layer 6 has a two-layer structure; if three layers or more are formed, these processes will be repeated.

Figure 11:
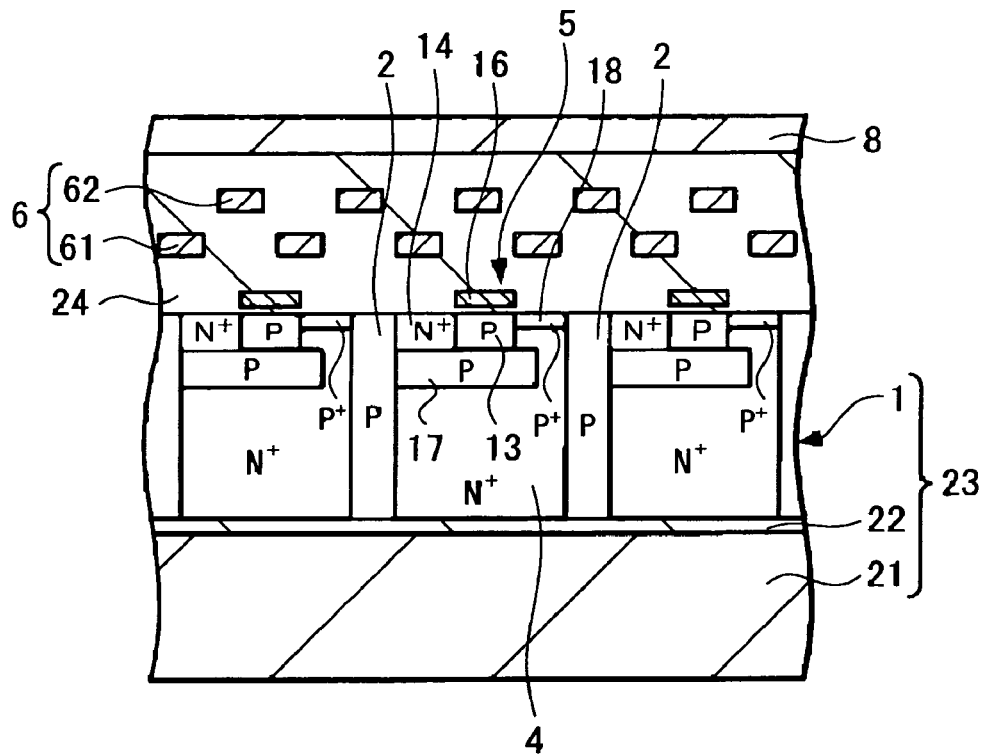
FIG. 11 is a (fifth) production process diagram showing an embodiment of a production method of a solid-state imaging device of the present invention.

Next, as shown in FIG. 11, a supporting substrate 8 is stuck on the wiring layer 6.

Specifically, an adhesive layer (not shown in the figure) is applied to the planarizing film to stick the supporting substrate 8 on the wiring layer 6.

Note that the supporting substrate 8 is stuck on the front surface side of the SOI substrate 23, so that mechanical strength is secured when the SOI substrate 23 is made to be thin in a process described later on.

Figure 12:
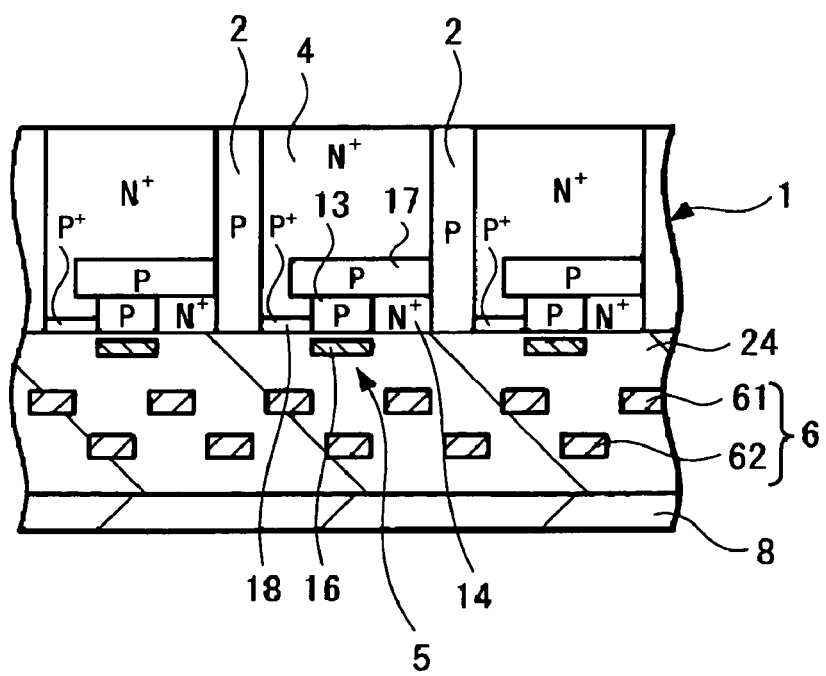
FIG. 12 is a (sixth) production process diagram showing an embodiment of a production method of a solid-state imaging device of the present invention.

Next, the back surface side of the SOI substrate 23, namely the silicon substrate 21 is exposed by inverting the whole construction. Then the exposed silicon substrate 21 and the buried oxide film 22 are removed sequentially, and the single-crystal silicon layer 1 is exposed as shown in FIG. 12.

Figure 13A:
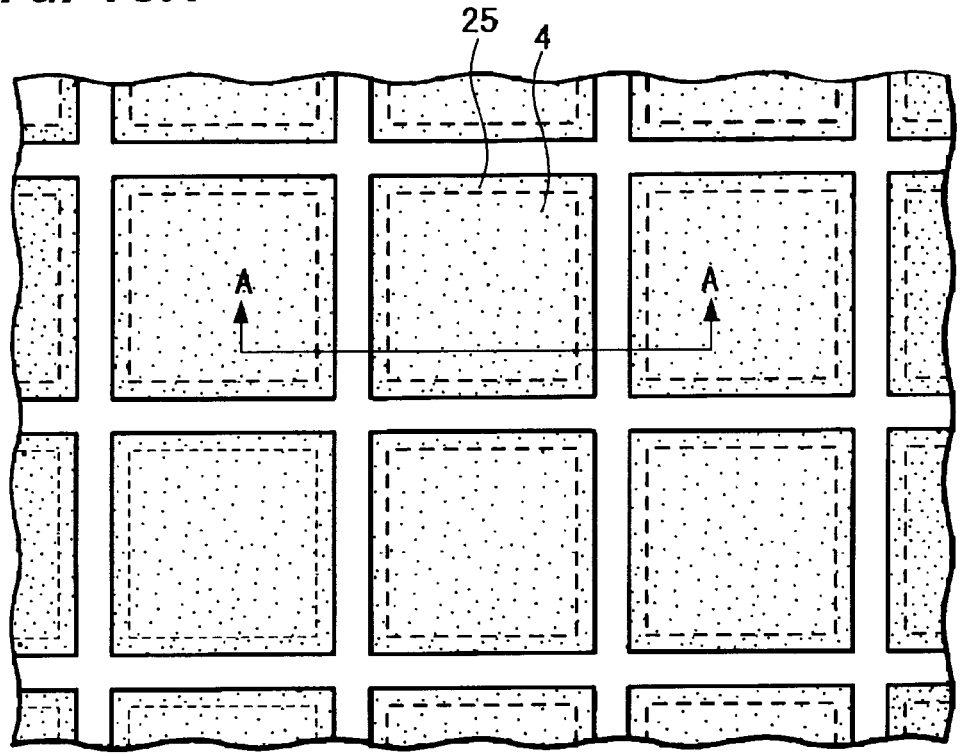
FIGS. 13A and 13B are (seventh) production process diagrams showing an embodiment of a production method of a solid-state imaging device of the present invention.
Figure 13B:
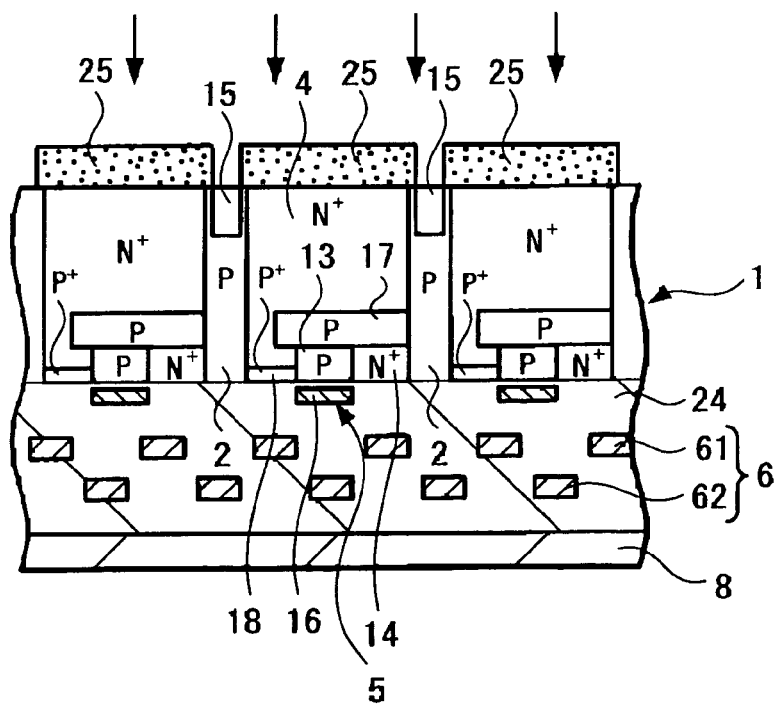

Next, in this embodiment, the gettering region 15 is formed in the element-isolation area 2 in the single-crystal silicon layer 1 in the vicinity of the back surface side, where image light enters, as shown in FIGS. 13A and 13B.

Specifically, a resist film (not shown in the figures) is first formed on the single-crystal silicon layer 1, and patterning is performed on this resist film using a known lithography technique to make a resist mask 25 for forming the gettering region 15 as shown in FIG. 13A.

On this occasion, as described later on, patterning is applied to the resist film such that the gettering region 15 is formed in a lattice shape. Further, the resist mask 25 is made larger both vertically and horizontally than each of the photoelectric conversion elements 4 so as not to make the sidewalls of gettering region 15 directly in contact with the sidewalls of the photoelectric conversion element 4. In other words, the resist mask 25 is formed to cover each of the photoelectric conversion elements 4 (refer to FIG. 13B).

Then, an impurity element (carbon) is injected into the single-crystal silicon layer 1 with the resist mask 25 thus formed serving as a mask, thereby forming on the front surface side in the element-isolation area 2 the gettering region 15 in the shape of a lattice to surround each of the unit pixel areas 3 disposed in the shape of a matrix, as shown in FIG. 13B.

On this occasion, the gettering region 15 can be formed on the back surface side in the element-isolation area 2 by adjusting the amount of energy and the amount of dose.

The energy amount of carbon can be regulated in the range of 20 KeV to 200 KeV, for example, and the dose amount thereof can be regulated in the range of $5.0 \times 10^{14}$ cm$^{-2}$ to $5.0 \times 10^{15}$ cm$^{-2}$, for example.

In this embodiment, carbon is injected with the energy amount of 100 KeV and the dose amount of $1.0 \times 10^{15}$ cm$^{-2}$.

Figure 14:
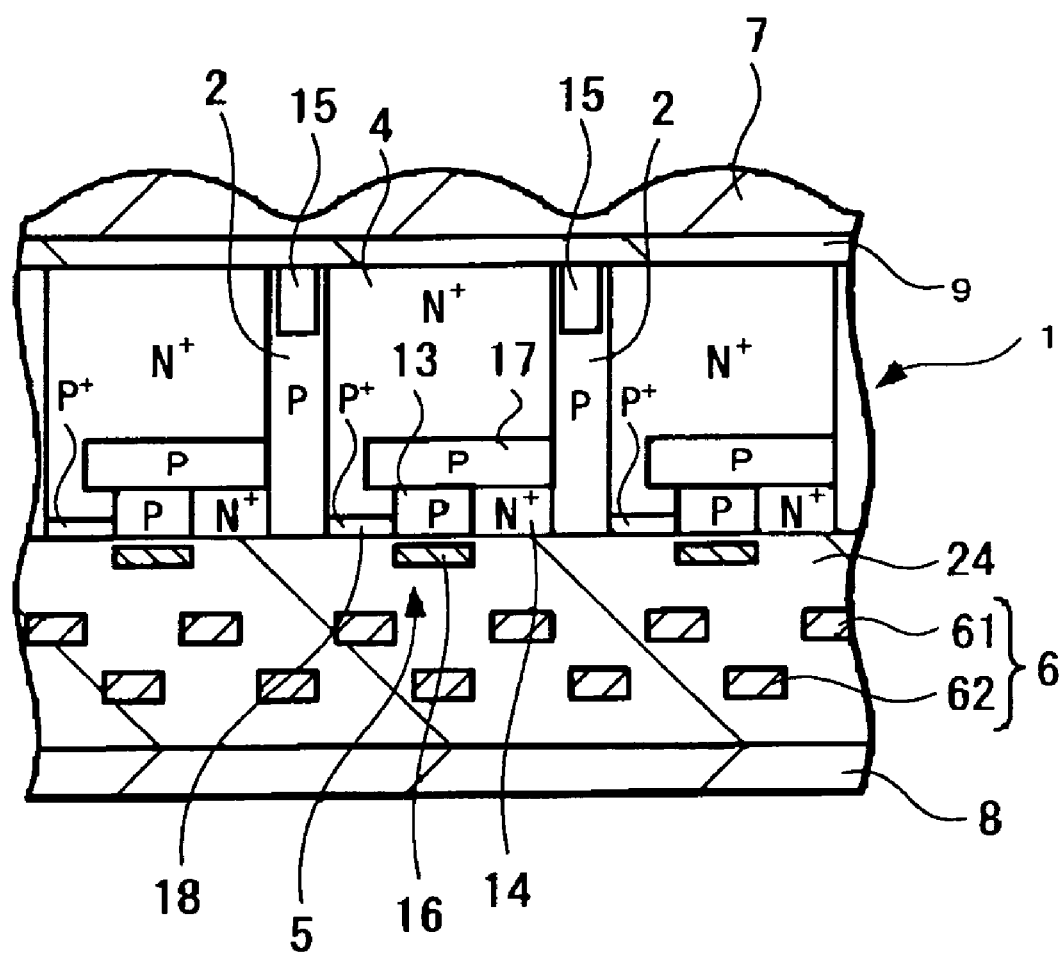
FIG. 14 is a (eighth) production process diagram showing an embodiment of a production method of a solid-state imaging device of the present invention.

Next, the resist mask 25 for forming the gettering region 15 is removed, and as shown in FIG. 14, a planarizing film (passivation film) 9, an antireflective film (not shown in the figure) and the like are formed on the single-crystal silicon layer 1, and further, on-chip lenses 7 are formed on this planarizing film 9 corresponding to each of the photoelectric conversion elements 4 formed in the single-crystal silicon layer 1. In addition, a color filter is formed before on-chip lenses 7 are formed in the case of a color image instead of black and white image.

As described above, a CMOS-type solid-state imaging device can be manufactured in which a gettering region 15 is formed on the back surface side in the element-isolation area 2.

In the manufacturing method of the solid-state imaging device 10 according to the above-described embodiment, since the gettering region 15 having such characteristics as repairing a crystalline defect and absorbing impurities is formed on the back surface side in the element-isolation area 2, a crystalline defect occurred in the single-crystal silicon layer 1 in the middle of the production process can be repaired.

Further, if unnecessary impurities exist in the semiconductor substrate 1, those impurities can be absorbed to restrain the progress of metal pollution caused by unnecessary metal impurities.

Thus, the occurrence of a dark current resulted from a crystalline defect and the occurrence of a pixel defect (white spot) resulted from metal pollution caused by unnecessary metal impurities can be reduced.

Further, since the gettering region 15 is formed in the element-isolation area 2, a crystalline defect can be repaired and unnecessary impurities can be absorbed without increasing the area of the unit pixel area 3.

Furthermore, since the gettering region 15 is formed on the back surface side in the element-isolation area 2 by injecting an impurity element from the back surface side of the single-crystal silicon layer 1, the gettering region 15 can be produced at low cost using a conventional injecting apparatus instead of using a particular injection apparatus and so on.

That is, in the case where the gettering region 15 is formed on the back surface side in the element-isolation area 2 by injecting an impurity element from the front surface side of the single-crystal silicon layer 1, it is necessary to inject an impurity element with high energy so as to make the impurity element surely injected from the front surface side to a predetermined position (depth) on the back surface side, which may require a high-performance injection apparatus.

Further, after forming the readout circuits 5, the wiring layer 6 and the like on the front surface side of the single-crystal silicon layer 1, the gettering region 15 is formed, so that gettering effectiveness can be performed at the maximum.

That is, in the case where the readout circuits 5 and the wiring layer 6 are formed on the front surface side of the single-crystal silicon layer 1 after the gettering region 15 is formed in a predetermined position (depth) on the back surface side of the single-crystal silicon layer 1, the gettering region 15 could be affected by heat produced in the processes of forming the readout circuits 5 and the wiring layer 6, and therefore gettering effectiveness may be lowered.

However, in the case where the gettering region 15 is formed in a predetermined position (depth) in the element-isolation area 2 after the readout circuits 5, the wiring layer 6 and the like are formed on the front surface side of the single-crystal silicon layer 1, the gettering region 15 is formed in the last stage of the production process, which prevents gettering effectiveness from lowering due to the gettering region 15 being affected by excessive heat in the production process.

In this embodiment, explanations are made with respect to the case in which such gettering region 15 in the shape of a lattice as shown in FIGS. 2A and 2B is formed; however, in the case where gettering regions 15 in the form of dots as shown in FIGS. 3A and 3B are formed, the resist mask 25 is formed by patterning a resist film to obtain the resist mask 25 in the form of dots in the process of forming a resist mask as shown in FIG. 12, and an impurity element is injected with the resist mask 25 serving as a mask, thereby forming the above gettering regions 15.

Further, as shown in FIGS. 4A and 4B, in the case where gettering regions 15 are formed inside the element-isolation area 2, the energy amount of an impurity element is further increased in the impurity element injection process shown in FIGS. 13A and 13B to form the gettering regions 15. In this case, an impurity element is injected with the energy amount of 150 KeV and the dose amount of $1.0 \times 10^{15}$ cm$^{-2}$.

As described above, in the embodiments of the present invention, the shape of the resist mask 25 and the amount of an impurity element injected are arbitrarily adjusted to form the gettering region 15 depending on the shape and position of the gettering region 15 to be obtained.

In this case, the resist mask 25 can be formed more easily depending on the shape of the gettering region 15 intended to obtain.

Specifically, in the case of the resist mask 25 for forming a lattice-shaped gettering region 15 as shown in FIG. 2, it is difficult to form the mask 25, because an island-shaped minute pattern is required both vertically and horizontally; however, in the case of resist mask 25 for forming gettering regions 15 in the form of dots as shown in FIGS. 3, 4 and 6, there is no need to form a resist mask having an island-shaped minute pattern both in the vertical and horizontal directions.

Further, without necessarily forming the gettering region 15 in part of each unit pixel area 3, it is possible to form gettering regions 15 at intervals between specific rows or columns of photoelectric conversion elements 4 disposed in the shape of a matrix.

In the case where gettering regions 15 are thus formed, the resist mask 25 can be formed more easily because the gettering regions 15 are provided at intervals between specific rows and columns.

In the above-described embodiments, while the cases are explained in which the gettering region 15 is formed in the element-isolation area 2 in the vicinity of the back surface side where image light enters, the gettering region 15 can be formed in the element-isolation area 2 in the vicinity of the areas where readout circuits 5 and so on are formed.

In the case where such structure is made, an impurity element is injected by adjusting the energy amount and the does amount thereof such that the gettering region 15 will be formed in the vicinity of the area where readout circuits 5 and so on are formed (in the vicinity of the front surface side) in the impurity element injection process shown in FIG. 13, for example.

In the above-described embodiments, the present invention is applied to a back-illuminated type CMOS-type solid-state imaging device, however, the present invention can also be applied to a back-illuminated type CCD-type solid-state imaging device, for example.

It should be noted that the present invention is not limited to the above-described embodiments, and various other structures can be used without departing from the gist of the present invention.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state imaging device comprising:

a semiconductor substrate having a plurality of photoelectric conversion elements formed proximate to a back surface side of said semiconductor substrate, each of said photoelectric conversion elements having an associated pixel area on said back surface side and at least one of the photoelectric conversion elements having an associated gettering region, said associated gettering region being formed proximate to the back surface side and substantially surrounding the associated pixel area of the at least one photoelectric conversion element, and said gettering region being formed of an element different from a semiconductor element constituting the initial background doping of said semiconductor substrate; and circuits formed on said semiconductor substrate for reading out signal charge from each of said plurality of photoelectric conversion elements, said circuits being positioned proximate to a first surface side of said semiconductor substrate, said first surface side facing away from said back surface side.

2. A solid-state imaging device according to claim 1, wherein said associated pixel areas are distributed in the shape of a matrix, and a gettering region is formed proximate to the back surface side between at least one of a pair of rows and a pair of columns of said matrix.

* * * * *